United States Patent
Jang

(10) Patent No.: US 8,391,062 B2
(45) Date of Patent: Mar. 5, 2013

(54) NONVOLATILE MEMORY DEVICE AND RELATED METHOD OF PROGRAMMING

(75) Inventor: Joon-Suc Jang, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 372 days.

(21) Appl. No.: 12/780,978

(22) Filed: May 17, 2010

(65) Prior Publication Data
US 2010/0321998 A1    Dec. 23, 2010

(30) Foreign Application Priority Data
Jun. 22, 2009    (KR) .................... 10-2009-0055397

(51) Int. Cl.
*G11C 16/04* (2006.01)
(52) U.S. Cl. ............ 365/185.03; 365/185.18; 365/185.2
(58) Field of Classification Search .............. 365/185.03, 365/185.09, 185.11, 185.18, 185.2, 185.22
See application file for complete search history.

(56) References Cited

U.S. PATENT DOCUMENTS

| | | | | |
|---|---|---|---|---|
| 7,206,224 B1 * | 4/2007 | Randolph et al. | ........ | 365/185.03 |
| 7,283,402 B2 * | 10/2007 | Randolph et al. | ........ | 365/185.29 |
| 7,991,960 B2 * | 8/2011 | Croxford et al. | .............. | 711/130 |
| 8,144,505 B2 * | 3/2012 | Lee | ................ | 365/163 |
| 2003/0234408 A1 * | 12/2003 | Tanaka | .......................... | 257/200 |

FOREIGN PATENT DOCUMENTS

| | | |
|---|---|---|
| JP | 2004103089 A | 4/2004 |
| KR | 100766241 B1 | 10/2007 |
| KR | 100836762 B1 | 6/2008 |

* cited by examiner

*Primary Examiner* — Gene Auduong
(74) *Attorney, Agent, or Firm* — Volentine & Whitt, PLLC

(57) ABSTRACT

A method of programming a nonvolatile memory device comprises pre-programming multi-bit data in a plurality of multi-level memory cells, reading the pre-programmed multi-bit data from the plurality of multi-level cells based on state group codes indicating state groups of the plurality of multi-level cells, and re-programming the read multi-bit data to the plurality of multi-level cells.

32 Claims, 12 Drawing Sheets

US 8,391,062 B2

NONVOLATILE MEMORY DEVICE AND RELATED METHOD OF PROGRAMMING

CROSS-REFERENCE TO RELATED APPLICATIONS

This application claims priority under 35 U.S.C. §119 to Korean Patent Application No. 10-2009-0055397 filed on Jun. 22, 2009, the disclosure of which is hereby incorporated by reference in its entirety.

BACKGROUND

The inventive concept relates generally to nonvolatile memory devices. More particularly, the inventive concept relates to nonvolatile memory devices comprising multi-level cells, and related methods of programming.

Flash memory devices in the past were limited to storing only one bit of data per memory cell. Recent technological advances, however, have allowed researchers to develop flash memory devices storing more than one bit of data per memory cell. Flash memory devices storing one bit of data per memory cell are referred to as single level cell (SLC) devices, and flash memory devices storing more than one bit of data per memory cell are referred to as multi-level cell (MLC) devices.

A flash memory device can store "N" bits of data per memory cell by programming each memory cell to one of $2^N$ different threshold voltage distributions. For instance, a flash memory cell can store two bits of data per memory cell by programming each memory cell to one of four ($2^2$=4) different threshold voltage distributions corresponding to four different two-bit states "11", "10", "00", and "01". The memory cells in the $2^N$ different threshold voltage distributions can be read by using different read voltages to determine the threshold voltage required to turn on each memory cell. A read voltage that is higher than a memory cell's threshold voltage will turn on memory cell on, providing an indication of the threshold voltage distribution to which the memory cell is programmed.

To ensure accurate read operations, the $2^N$ threshold voltage distributions must be separated from each other by an adequate read margin. If two threshold voltage distributions overlap each other or are too close together, memory cells belonging to one distribution may be erroneously read as belonging to the other distribution. Unfortunately, the increasing performance demands of modern flash memory devices continue to require smaller read margins. Moreover, certain aspects of newer flash memory devices, such as increasing integration density, may cause threshold voltage distributions to widen due to electrical coupling between adjacent memory cells.

SUMMARY

Selected embodiments of the inventive concept provide nonvolatile memory devices and related methods capable of improving the efficiency of programming operations.

According to one embodiment of the inventive concept, a programming method is provided for a nonvolatile memory device comprising a plurality of multi-level cells. The method comprises pre-programming multi-bit data in the plurality of multi-level cells, reading the pre-programmed multi-bit data from the plurality of multi-level cells based on state group codes indicating state groups of the plurality of multi-level cells, and re-programming the read multi-bit data in the plurality of multi-level cells.

In certain embodiments, each of the state groups corresponds to a set of non-overlapping threshold voltage distributions.

In certain embodiments, the number of the state groups is determined based on a maximum number of overlapping threshold voltage distributions of the plurality of multi-level cells. In certain embodiments, the number of bits in each state group code is determined by the number of the state groups.

In certain embodiments, the method further comprises operating a controller to load the multi-bit data in a page buffer unit of the nonvolatile memory device to pre-program the loaded multi-bit data in the plurality of multi-level cells.

In certain embodiments, the method further comprises generating the state group codes based on the multi-bit data loaded in the page buffer unit.

In certain embodiments, generating the state group codes comprises performing a logical operation on bits of the loaded multi-bit data to generate the state group codes.

In certain embodiments, the method further comprises temporarily storing the generated state group codes in the page buffer unit.

In certain embodiments, the method further comprises storing the generated state group codes in a state group code memory block.

In certain embodiments, the method further comprises, the state group code memory block comprises single-level cells.

In certain embodiments, the method further comprises operating the controller to load the state group codes to the page buffer unit.

In certain embodiments, the method further comprises identifying threshold voltages of the multi-level cells after the multi-bit data is pre-programmed in the multi-level cells, and generating the state group codes based on the identified threshold voltages.

In certain embodiments, reading the pre-programmed multi-bit data comprises reading the pre-programmed multi-bit data on a state group basis by applying different read voltages according to the state group codes.

In certain embodiments, pre-programming the multi-bit data comprises applying pre-program verify voltages having magnitudes lower than desired threshold voltages, and re-programming the read multi-bit data comprises applying re-program verify voltages having magnitudes substantially the same as the desired threshold voltages.

According to another embodiment of the inventive concept, a programming method is provided for a nonvolatile memory device comprising a first plurality of multi-level cells connected to a first wordline and a second plurality of multi-level cells connected to a second wordline. The method comprises pre-programming first multi-bit data in the first plurality of multi-level cells, pre-programming second multi-bit data in the second plurality of multi-level cells, reading the pre-programmed first multi-bit data from the first plurality of multi-level cells based on first state group codes indicating state groups of the first plurality of multi-level cells, and re-programming the read first multi-bit data in the first plurality of multi-level cells.

In certain embodiments, the second wordline is adjacent to the first wordline.

In certain embodiments, the pre-programmed first multi-bit data is read from the first plurality of multi-level cells after the second multi-bit data is pre-programmed in the second plurality of multi-level cells.

In certain embodiments, the method further comprises pre-programming third multi-bit data in a third plurality of multi-level cells connected to a third wordline, wherein the third wordline is adjacent to the second wordline, reading the pre-programmed second multi-bit data from the second plurality of multi-level cells based on second state group codes after the third multi-bit data is pre-programmed in the third plurality of multi-level cells, and re-programming the read second multi-bit data to the second plurality of multi-level cells.

According to still another embodiment of the inventive concept, a nonvolatile memory device comprises a plurality of multi-level cells, and a control circuit. The control circuit controls the nonvolatile memory device to perform a pre-programming operation to pre-program multi-bit data in the plurality of multi-level cells, a read operation to read the pre-programmed multi-bit data from the plurality of multi-level cells based on state group codes indicating state groups of the plurality of multi-level cells, and a re-programming operation to re-program the read multi-bit data in the plurality of multi-level cells.

In certain embodiments, each of the state groups corresponds to a set of non-overlapping threshold voltage distributions.

BRIEF DESCRIPTION OF THE DRAWINGS

Embodiments of the inventive concept are presented below with reference to the accompanying drawings. In the drawings, like reference numbers denote like features.

DETAILED DESCRIPTION OF THE EMBODIMENTS

Selected embodiments of the inventive concept are described below with reference to the accompanying drawings. These embodiments are provided as teaching examples and should not be interpreted to limit the scope of the inventive concept.

Although certain terms of distinction, such as first, second, and third, are used herein to describe various elements, these elements should not be limited by these terms. Rather, these terms are used to distinguish one element from another. Thus, a first element discussed below could be termed a second element without departing from the teachings of the inventive concept. As used herein, the term "and/or" includes any and all combinations of one or more of the associated listed items.

Where an element is referred to as being "connected" to another element, it can be directly connected to the other element or intervening elements may be present. In contrast, where an element is referred to as being "directly connected" to another element, there are no intervening elements present. Other words used to describe the relationship between elements should be interpreted in a similar fashion (e.g., "between" versus "directly between," "adjacent" versus "directly adjacent," etc.).

The terminology used herein is for the purpose of describing particular example embodiments only and is not intended to be limiting of the inventive concept. As used herein, the singular forms "a," "an," and "the" are intended to include the plural forms as well, unless the context clearly indicates otherwise. It will be further understood that the terms "comprises" and/or "comprising," where used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
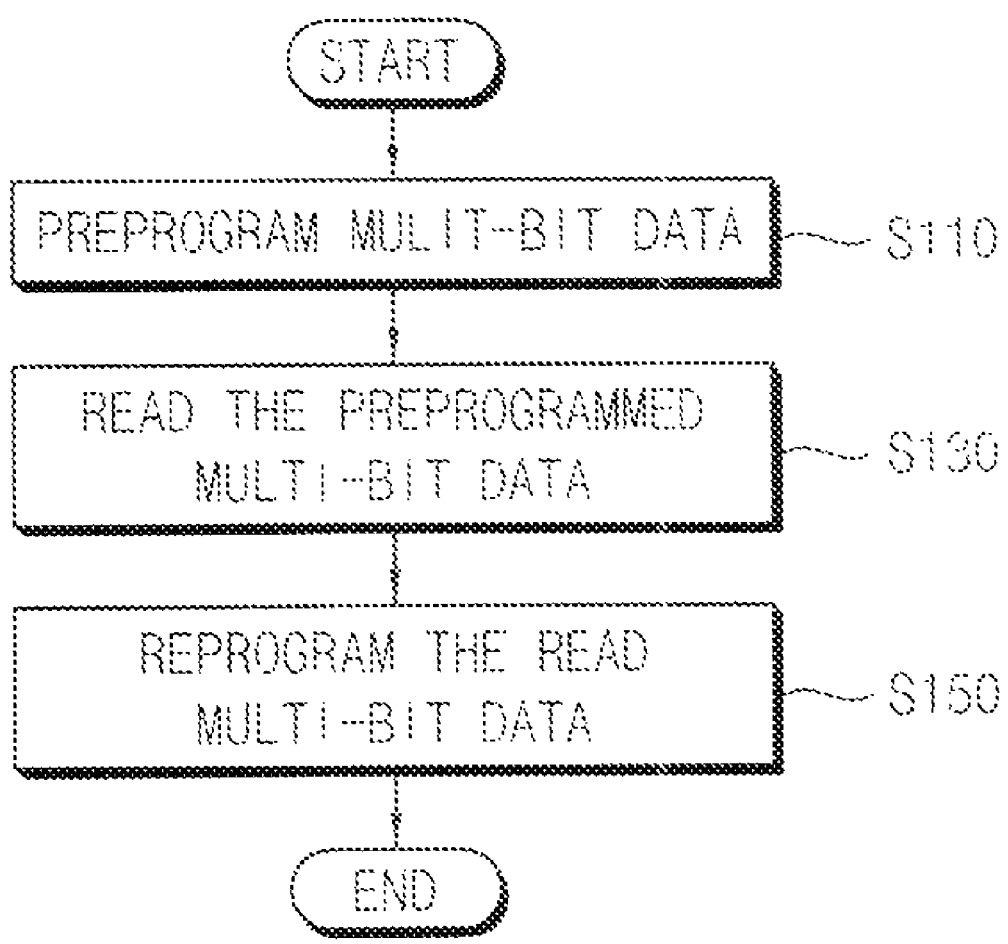
FIG. 1 is a flow chart illustrating a method of programming a nonvolatile memory device according to an embodiment of the inventive concept.

FIG. 1 is a flow chart illustrating a method of programming a nonvolatile memory device according to an embodiment of the inventive concept. In the description that follows, example method steps are indicated by parentheses (SXXX) to distinguish them from example apparatus elements.

Referring to FIG. 1, during a program operation of a nonvolatile memory device, multi-bit data is pre-programmed in a plurality of multi-level cells (S110). Each unit of multi-bit data comprises at least two bits to be programmed to a corresponding multi-level cell. The multi-bit data is pre-programmed in the multi-level cells in units of a page, where a page comprises predetermined number of bits.

In some embodiments, the number of bits in a page is equal to a number of a memory cells connected to a common wordline of a flash memory device. The memory cells can be pre-programmed with a page of data by applying appropriate voltages to the common wordline and to bitlines connected to the memory cells. Where the memory cells connected to the common wordline are multi-level cells, multiple pages can be pre-programmed in the memory cells. For instance, in multi-level cells storing three bits per cell, a first page corresponding to least significant bit (LSB) data can be pre-programmed in the memory cells, followed by a second page corresponding to central significant bit (CSB) data, followed by a third page corresponding to most significant bit (MSB) data. In other embodiments, all bits of multi-bit data can be pre-programmed in a single operation.

Following precharging, the multi-level cells have threshold voltages corresponding to the multi-bit data. For example, where each multi-bit data has three bits, each multi-level cell has a threshold voltage corresponding to one of eight threshold voltage distributions (i.e., eight states including one erased state and seven programmed states).

Due to electrical coupling between multi-level cells, the threshold voltages distributions of the multi-level cells may overlap after the pre-programming operation. For example, the threshold voltages of the multi-level cells may be widened due to capacitive coupling induced by parasitic capacitance between floating gates of adjacent multi-level cells. This widening may result in overlaps between threshold voltages distributions of the multi-level cells.

The pre-programmed multi-bit data is then read from the multi-level cells based on state group codes, which indicate groups of threshold voltage distributions that do not overlap (S130). The threshold voltage distributions are typically divided into at least two state groups where each state group comprises threshold voltage distributions that do not overlap with each other. By reading the pre-programmed multi-bit data from multi-level cells based on state group codes, the multi-bit data can be recovered even in the presence of overlapping threshold voltage distributions, as will be explained in further detail with reference to additional drawings below.

The state group codes can be generated by the nonvolatile memory device or by a controller connected to the nonvolatile memory device. In some embodiments, the state group codes are generated by performing a logical operation on each unit of multi-bit data loaded to a page buffer unit of the nonvolatile memory device. In other embodiments, the controller generates the state group codes and loads the generated state group codes into the nonvolatile memory device. In still other embodiments, the nonvolatile memory device identifies threshold voltages of the multi-level cells after the multi-bit data is pre-programmed but before threshold voltage distributions become overlapped, and generates the state group codes based on the identified threshold voltages.

After the pre-programmed multi-bit data has been read, the multi-level cells are re-programmed with the multi-bit data (S150). The re-programming operation typically uses higher verify voltages than the pre-program operation. In some embodiments, these verify voltages are established at the level of desired threshold voltages of the programmed multi-level cells.

In the re-program operation, each threshold voltage distribution tends to narrow. Moreover, the re-program operation tends to increase the threshold voltages of the multi-level cells by a smaller amount than the pre-programming operation, reducing the effects of electrical coupling between memory cells. Accordingly, the re-program operation tends to produce narrower threshold voltage distributions than the pre-programming operation.

By using the state group codes to indicate non-overlapping threshold voltage distributions of the multi-level cells after the pre-programming operation, the nonvolatile memory device can accurately read the multi-level cells even in the presence of overlapping threshold voltage distributions. Accordingly, the nonvolatile memory device can perform re-programming operations without re-loading the multi-bit data from an external source, which can increase the programming performance of the nonvolatile memory device.

Figure 2:
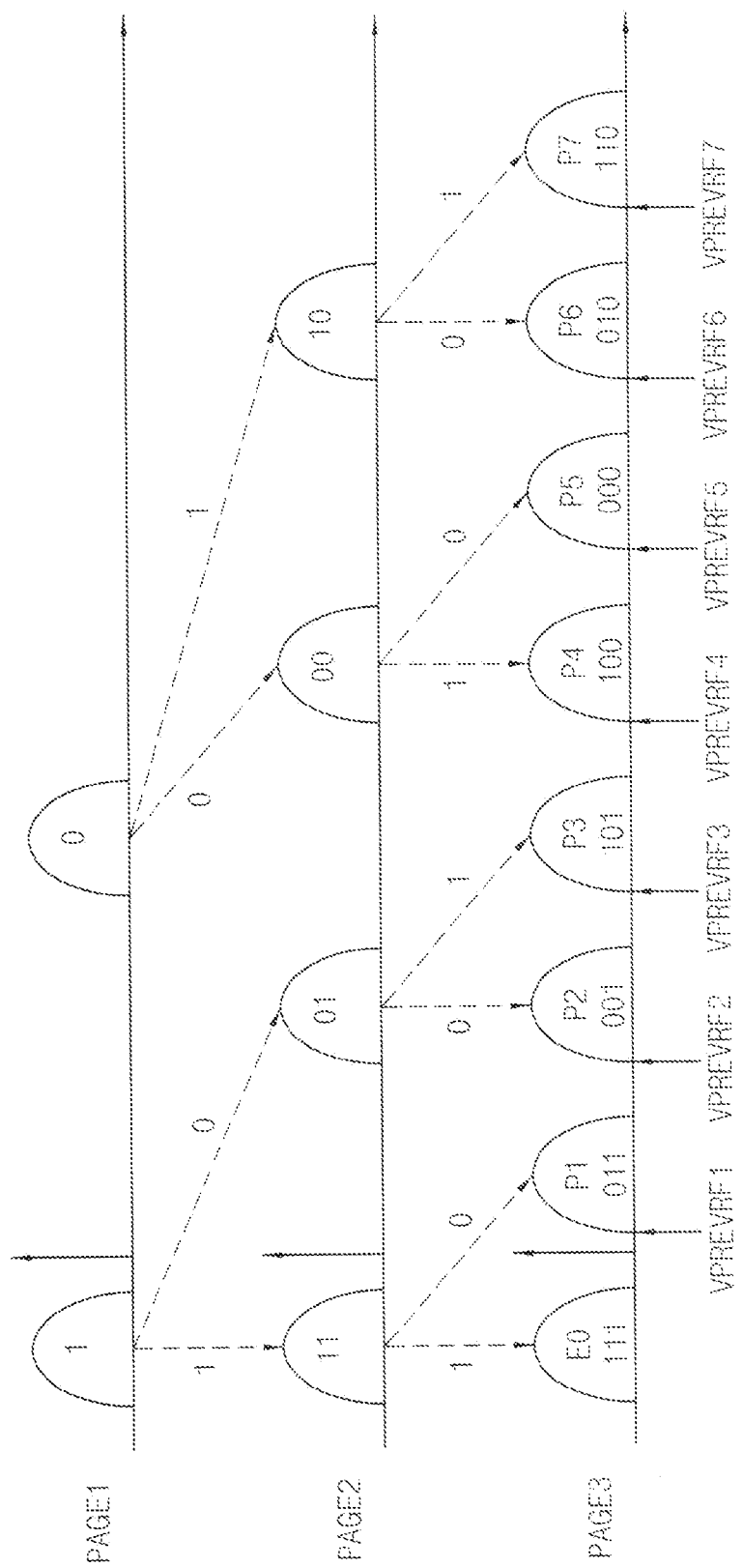
FIG. 2 is a diagram illustrating threshold voltage distributions of multi-level cells in a pre-program operation.

FIG. 2 is a diagram illustrating an example of threshold voltage distributions of multi-level cells in a pre-program operation. The multi-level cells store three pages of data.

Referring to FIG. 2, following a first page pre-program operation performed on a first page "PAGE 1" (e.g., LSB data) of multi-bit data, each pre-programmed multi-level cell has a threshold voltage distribution (or state) corresponding to data "1" or a threshold voltage distribution corresponding to data "0". In this example, the state corresponding to data "1" is an erased state.

Following a second page pre-program operation performed on a second page "PAGE 2" (e.g., CSB data), each multi-level cell previously having a threshold voltage distribution corresponding to data "1" has a threshold voltage distribution corresponding to data "11" or a threshold voltage distribution corresponding to data "01", and each multi-level cell previously having a threshold voltage distribution corresponding to data "0" has a threshold voltage distribution corresponding to data "00" or a threshold voltage distribution corresponding to data "10".

Following a third page pre-program operation performed on a third page "PAGE 3" (e.g., MSB data), each multi-level cell previously having the threshold voltage distribution corresponding to data "11" has a first threshold voltage distribution E0 corresponding to data "111" or a second threshold voltage distribution P1 corresponding to data "011", each multi-level cell previously having the threshold voltage distribution corresponding to data "01" has a third threshold voltage distribution P2 corresponding to data "001" or a fourth threshold voltage distribution P3 corresponding to data "101", each multi-level cell previously having the threshold voltage distribution corresponding to data "00" has a fifth threshold voltage distribution P4 corresponding to data "100" or a sixth threshold voltage distribution P5 corresponding to data "000", and each multi-level cell previously having the threshold voltage distribution corresponding to data "10" has a seventh threshold voltage distribution P6 corresponding to data "010" or an eighth threshold voltage distribution P7 corresponding to data "110".

The third page pre-program operation is performed using pre-program verify voltages VPREVRF1, VPREVRF2, VPREVRF3, VPREVRF4, VPREVRF5, VPREVRF6, and VPREVRF7. For example, multi-bit data "110" is pre-programmed in a corresponding multi-level cell such that the multi-level cell has a threshold voltage higher than a seventh pre-program verify voltage VPREVRF7, multi-bit data "010" is pre-programmed in a corresponding multi-level cell such that the multi-level cell has a threshold voltage higher than a sixth pre-program verify voltage VPREVRF6, multi-bit data "000" is pre-programmed in a corresponding multi-level cell such that the multi-level cell has a threshold voltage higher than a fifth pre-program verify voltage VPREVRF5, multi-bit data "100" is pre-programmed in a corresponding multi-level cell such that the multi-level cell has a threshold voltage higher than a fourth pre-program verify voltage VPREVRF4, multi-bit data "101" is pre-programmed in a corresponding multi-level cell such that the multi-level cell has a threshold voltage higher than a third pre-program verify voltage VPREVRF3, multi-bit data "001" is pre-programmed in a corresponding multi-level cell such that the multi-level cell has a threshold voltage higher than a second pre-program verify voltage VPREVRF2, and multi-bit data "011" is pre-programmed in a corresponding multi-level cell such that the multi-level cell has a threshold voltage higher than a first pre-program verify voltage VPREVRF1.

In some embodiments, the first page pre-program operation, the second page pre-program operation, and the third page pre-program operation are incremental step pulse program (ISPP) operations. For example, to pre-program multi-bit data "110", a program operation and verify operation can be performed with a gradually increasing program voltage in successive program loops and with pre-program verify voltage VPREVRF7.

While FIG. 2 illustrates a pre-program operation where bits of the multi-bit data are sequentially pre-programmed, in some embodiments, all bits of the multi-bit data can be substantially simultaneously pre-programmed. Further, while FIG. 2 illustrates a pre-program operation where multi-bit data is assigned to threshold voltage distributions in gray ordering, the multi-bit data may be assigned to the threshold voltage distributions in various orderings, such as binary ordering, or various other forms of orderings.

Figure 3:
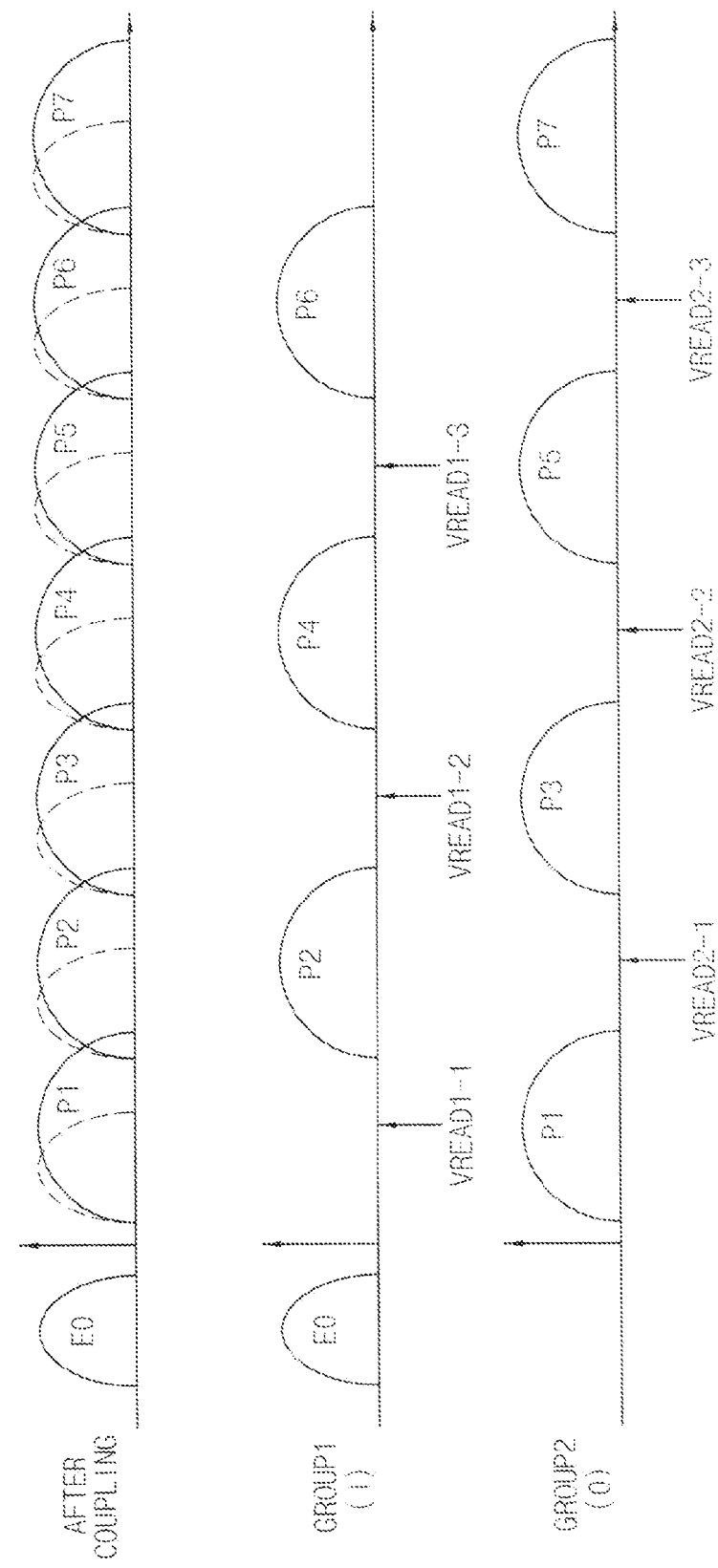
FIG. 3 is a diagram illustrating an example of threshold voltage distributions of MLCs during a read operation.

FIG. 3 is a diagram illustrating an example of threshold voltage distributions of multi-level cells during a read operation.

Referring to FIG. 3, the multi-level cells have threshold voltage distributions that are wider than the threshold voltage distributions obtained shortly after a pre-program operation (See, e.g., FIG. 2). The threshold voltage distributions in FIG. 3 are wider than those in FIG. 2 because of capacitive coupling induced by parasitic capacitance between floating gates of adjacent multi-level cells.

Due to this widening, some of the threshold voltage distributions of FIG. 3 overlap with each other. For example, a second threshold voltage distribution P1 overlaps with a third threshold voltage distribution P2. The overlap between adjacent threshold voltage distributions may produce errors in read operations of conventional nonvolatile memory devices. However, in certain embodiments of the inventive concept, read operations are performed in state groups based on state group codes, allowing pre-programmed data to be read accurately.

To perform a read operation using state groups, threshold voltage distributions E0, P1, P2, P3, P4, P5, P6 and P7 are divided into state groups GROUP1 and GROUP2 such that each state group comprises threshold voltage distributions that do not overlap. For example, first through eighth threshold voltage distributions E0, P1, P2, P3, P4, P5, P6 and P7 are divided into first state group GROUP1 and second state group GROUP2. First state group GROUP 1 comprises first threshold voltage distribution E0, third threshold voltage distribution P2, fifth threshold voltage distribution P4, and seventh threshold voltage distribution P6, which do not overlap. Second state group GROUP2 comprises second threshold voltage distribution P1, fourth threshold voltage distribution P3, sixth threshold voltage distribution P5, and eighth threshold voltage distribution P7, which do not overlap.

The number of bits of each state group code is typically based on the number of the state groups. For example, where the number of the state groups is two, each state group code typically comprises one bit. Where the number of the state groups is three or four, each state group code typically comprises two bits. The number of state groups can be determined based on the maximum number of threshold voltage distributions that overlap at any point. In an example illustrated in FIG. 2, a maximum of two threshold voltage distributions overlap at any point, and therefore the number of the state groups is two.

The read operation of FIG. 3 is performed in the state groups. A first read operation is performed for multi-level cells having state group code "1" indicating first state group GROUP1, and a second read operation is performed for multi-level cells having state group code "0" indicating second state group GROUP2. During the first read operation, a read voltage VREAD1-3 is applied to a selected wordline, and multi-level cells having state group code "1" are read while memory cells having state group code "0" are ignored.

Similarly, during the second read operation, a read voltage VREAD2-3 is applied to the selected wordline, and multi-level cells having state group code "0" are read while memory cells having state group code "1" are ignored.

During the first read operation, first read voltages VREAD1-3, VREAD1-2 and VREAD1-1 are sequentially applied to the selected wordline to identify a threshold voltage distribution of each multi-level cell corresponding to first state group GROUP1 from among first threshold voltage distribution E0, third threshold voltage distribution P2, fifth threshold voltage distribution P4, and seventh threshold voltage distribution P6. During the second read operation, second read voltages VREAD2-3, VREAD2-2 and VREAD2-1 are sequentially applied to the selected wordline to identify a threshold voltage distribution of each multi-level cell corresponding to second state group GROUP2 from among second threshold voltage distribution P1, fourth threshold voltage distribution P3, sixth threshold voltage distribution P5, and eighth threshold voltage distribution P7. In alternative embodiments, first read voltages VREAD1-3, VREAD1-2 and VREAD1-1 and second read voltages VREAD2-3, VREAD2-2 and VREAD2-1 can applied in different orders.

As described above, because the read operation is performed based on state group codes, the pre-programmed multi-bit data can be read accurately from the multi-level cells even though the threshold voltage distributions are overlapped by the coupling.

Figure 4:
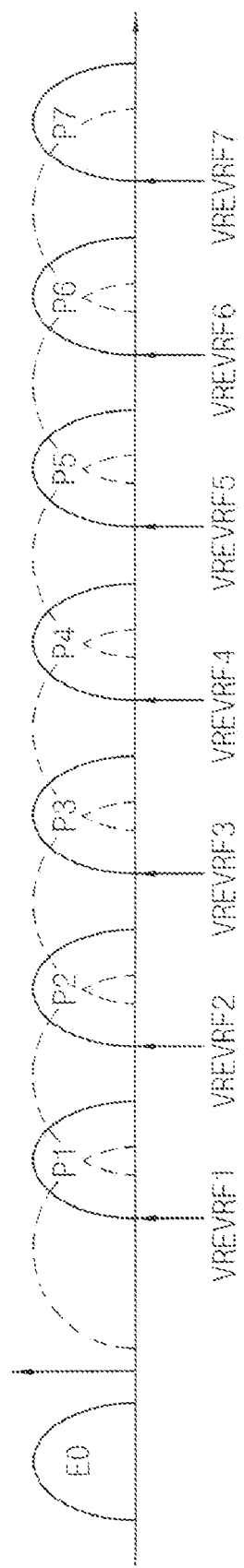
FIG. 4 is a diagram illustrating an example of threshold voltage distributions of MLCs during a re-program operation.

FIG. 4 is a diagram illustrating example threshold voltage distributions of multi-level cells during a re-program operation.

Referring to FIG. 4, multi-bit data read from multi-level cells is re-programmed to the multi-level cells such that the multi-level cells have first through eighth threshold voltage distributions E0, P1, P2, P3, P4, P5, P6 and P7 narrower than the threshold voltage distributions of FIG. 3 that were affected by coupling. The re-program operation is performed using re-program verify voltages VREVRF1, VREVRF2, VREVRF3, VREVRF4, VREVRF5, VREVRF6 and VREVRF7. For example, multi-level cells having eighth threshold voltage distribution P7 are re-programmed to have threshold voltages higher than seventh re-program verify voltage VREVRF7.

In some embodiments, the re-program operation is an ISPP operation. For example, where the multi-bit data is re-programmed to eighth threshold voltage distribution P7, program operation and the verify operations are performed in successive program loops with a gradually increasing program voltage in each loop and the seventh re-program verify voltage VREVRF7 applied to a selected wordline.

Re-program verify voltages VREVRF1, VREVRF2, VREVRF3, VREVRF4, VREVRF5, VREVRF6 and VREVRF7 are higher than respective pre-program verify voltages VPREVRF1, VPREVRF2, VPREVRF3, VPREVRF4, VPREVRF5, VPREVRF6 and VPREVRF7 illustrated in FIG. 2. For example, first re-program verify voltage VREVRF1 is higher than first pre-program verify voltage VPREVRF1. The pre-program operation is performed using pre-program verify voltages VPREVRF1, VPREVRF2, VPREVRF3, VPREVRF4, VPREVRF5, VPREVRF6 and VPREVRF7 lower than desired threshold voltages, and the re-program operation is performed using the re-program verify voltages VREVRF1, VREVRF2, VREVRF3, VREVRF4, VREVRF5, VREVRF6 and VREVRF7 substantially the same as the desired threshold voltages. Accordingly, the pre-program operation may be performed efficiently, and the multi-level cells may have the desired threshold voltages by the re-program operation. In alternative embodiments, the pre-program operation can be performed with pre-program verify voltages having the same magnitude as corresponding re-program verify voltages.

The re-program operation causes each threshold voltage distribution to become narrower. Because the threshold voltage increases by a smaller amount during the re-program operation than in the pre-program operation, the threshold voltage distributions after the re-program operation are less affected by coupling than those after the pre-program operation. Accordingly, the re-program operation causes the multi-level cells to have narrower threshold voltage distributions.

By using the state group codes to indicate non-overlapping threshold voltage distributions of the multi-level cells after the pre-programming operation, the nonvolatile memory device can accurately read the multi-level cells even in the presence of overlapping threshold voltage distributions. Accordingly, the nonvolatile memory device can perform re-programming operations without re-loading the multi-bit data from an external source, which can increase the programming performance of the nonvolatile memory device.

Figure 5:
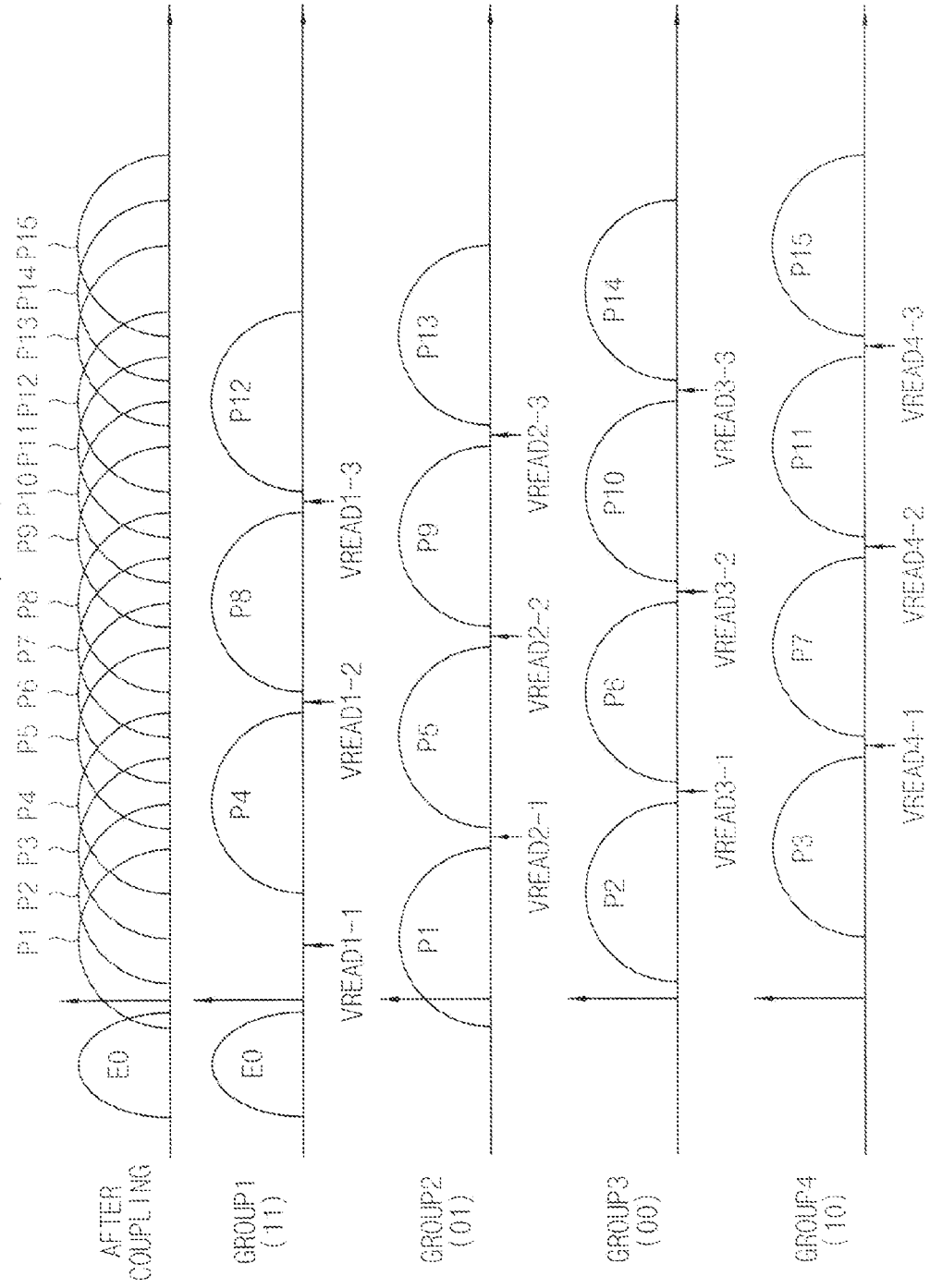
FIG. 5 is a diagram illustrating another example of threshold voltage distributions of MLCs during a read operation.

FIG. 5 is a diagram illustrating another example of threshold voltage distributions of MLCs during a read operation.

FIG. 5 illustrates an example where four bits of data are stored in multi-level cells. Referring to FIG. 5, the multi-level cells have threshold voltage distributions E0, P1, P2, P3, P4, P5, P6, P7, P8, P9, P10, P11, P12, P13, P14 and P15 wider than threshold voltage distributions shortly after a pre-program operation. Threshold voltage distributions E0, P1, P2, P3, P4, P5, P6, P7, P8, P9, P10, P11, P12, P13, P14 and P15 overlap with each other.

Threshold voltage distributions E0, P1, P2, P3, P4, P5, P6, P7, P8, P9, P10, P11, P12, P13, P14 and P15 are divided into state groups GROUP1, GROUP2, GROUP3 and GROUP4 such that each state group comprises threshold voltage distributions that do not overlap. For example, first through sixteenth threshold voltage distributions E0, P1, P2, P3, P4, P5, P6, P7, P8, P9, P10, P11, P12, P13, P14 and P15 are divided into a first state group GROUP1, a second state group GROUP2, a third state group GROUP3, and a fourth state group GROUP4.

First state group GROUP1 comprises first threshold voltage distribution E0, fifth threshold voltage distribution P4, ninth threshold voltage distribution P8, and thirteenth threshold voltage distribution P12, which do not overlap. Second state group GROUP2 comprises second threshold voltage distribution P1, sixth threshold voltage distribution P5, tenth threshold voltage distribution P9, and fourteenth threshold voltage distribution P13, which do not overlap. Third state group GROUP3 comprises third threshold voltage distribution P2, seventh threshold voltage distribution P6, eleventh threshold voltage distribution P10, and fifteenth threshold voltage distribution P14, which do not overlap. Fourth state group GROUP4 comprises fourth threshold voltage distribution P3, eighth threshold voltage distribution P7, twelfth threshold voltage distribution P11, and sixteenth threshold voltage distribution P15, which do not overlap.

State group codes are assigned to state groups GROUP1, GROUP2, GROUP3 and GROUP4. For example, a state group code "11" is assigned to first state group GROUP1, a state group code "01" is assigned to second state group GROUP2, a state group code "00" is assigned to third state group GROUP3, and a state group code "10" is assigned to fourth state group GROUP4. The number of bits in each state group code is typically determined based on the number of the state groups, and the number of state groups is typically determined based on the maximum number of threshold voltage distributions that are overlapped in any point. In the example of FIG. 5, a maximum of four threshold voltage distributions overlap in some points, and therefore the number of state groups is four, and the number of bits of each state group code is two.

The read operation is performed on a state group basis. That is, read operations are independently performed on each state group based on the state group codes. For example, in a read operation of first state group GROUP1, during application of a read voltage VREAD1-3 to a selected wordline, data is read from only multi-level cells having state group code "11", and cells having state group codes "01", "00" and "10" are ignored.

As described above, since the read operation is performed based on the state group codes, pre-programmed multi-bit data can be read accurately from the multi-level cells even in the presence of overlapping threshold voltage distributions caused by coupling between the multi-level cells.

While FIG. 5 illustrates an example where a maximum of four threshold voltage distributions overlap, the maximum number of the overlapping threshold voltage distributions can vary according to a distance between cells, the number of the ISPP, the increment of the program voltage, and other factors.

Figure 6:
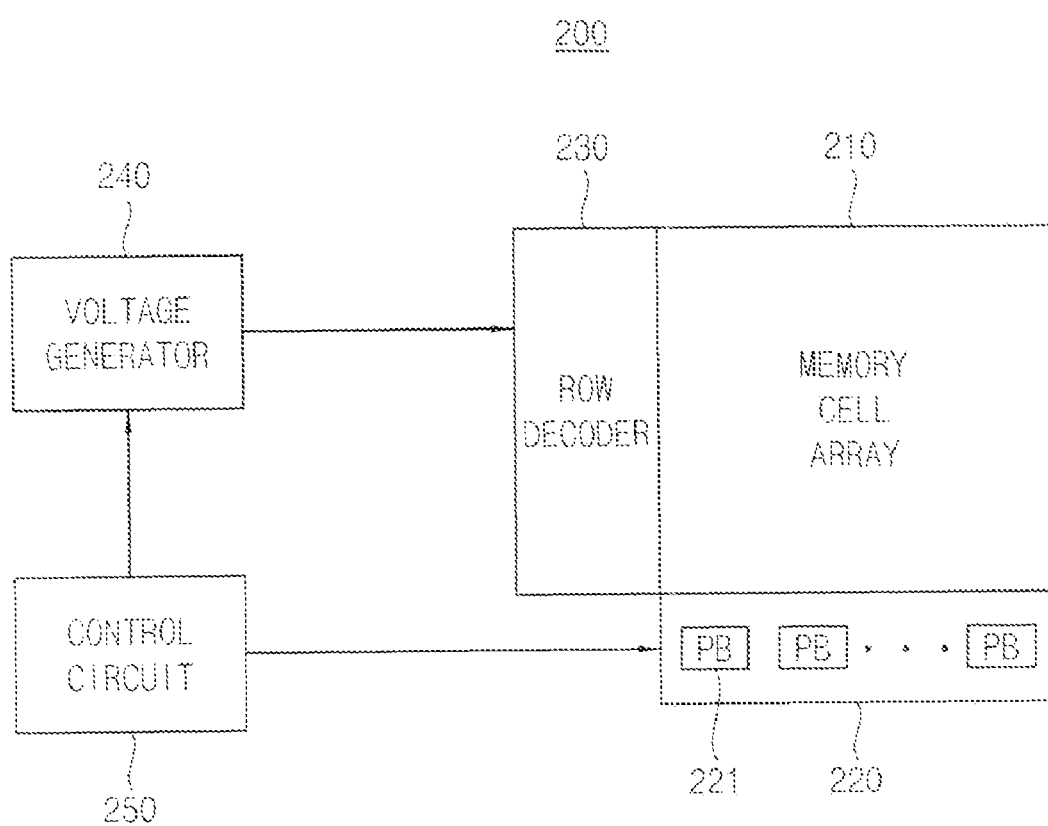
FIG. 6 is a block diagram illustrating a nonvolatile memory device according to an embodiment of the inventive concept.

FIG. 6 is a block diagram illustrating a nonvolatile memory device 200 according to an embodiment of the inventive concept.

Referring to FIG. 6, nonvolatile memory device 200 comprises a memory cell array 210, a page buffer unit 220, a row decoder 230, a voltage generator 240, and a control circuit 250.

Memory cell array 210 comprises a plurality of multi-level cells connected to a plurality of wordlines and a plurality of bitlines. Each multi-level cell can store at least two bits of multi-bit data. The multi-bit data is programmed to the multi-level cells by performing a pre-program operation, a read operation, and a re-program operation.

The multi-bit data is typically pre-programmed using pre-program verify voltages lower than desired threshold voltages. After the pre-programming, the threshold voltage distributions of the multi-level cells may overlap due to electrical coupling between adjacent multi-level cells. The pre-programmed multi-bit data is read from the multi-level cells based on state group codes indicating state groups comprising non-overlapping threshold voltage distributions. The read multi-bit data is re-programmed using re-program verify voltages such that the multi-level cells have threshold voltages substantially the same as the desired threshold voltages.

Page buffer unit 220 operates as a write driver or sense amplifier for memory cell array 210 based on an operating mode of nonvolatile memory device 200. For example, page buffer unit 220 operates as a sense amplifier in a read mode, and operates as a write driver in a write mode. Page buffer unit 220 comprises a plurality of page buffers PB (also labeled 221) connected to the plurality of bitlines. Each page buffer PB stores one unit of multi-bit data and one state group code indicating a state group of a corresponding multi-level cell. Each page buffer PB comprises data latches connected to a corresponding bitline. The data latches temporarily store the multi-bit data.

In some embodiments, at least one data latch temporarily stores a state group code received from an external controller. For example, where the multi-bit data is loaded into page buffer unit 220, the state group codes are loaded from the controller to the data latches included in page buffers PB. In other example, where the pre-programmed multi-bit data is verified using the pre-program verify voltages during the pre-program operation, the state group codes are loaded from the controller to the data latches included in page buffers PB.

In other embodiments, the state group codes are generated based on threshold voltages of the multi-level cells after the pre-program operation but before threshold voltage distributions become overlapped, and the generated state group codes are temporarily stored in the data latches included in corresponding page buffers PB. In still other embodiments, each page buffer PB comprises a logic circuit that generates a state group code by performing a logical operation on bits of the multi-bit data stored in the page buffer PB. Each page buffer PB may further comprise a state group code latch that temporarily stores the state group code generated by the logic circuit.

Row decoder 230 selects a wordline in response to a row address. Row decoder 230 transfers wordline voltages from voltage generator 240 to selected and non-selected wordlines. During a program operation, row decoder 230 applies a program voltage to the selected wordline and applies a pass voltage to the non-selected wordlines.

Voltage generator 240 is controlled by control circuit 250 and generates the wordline voltages, such as the program voltage, the pass voltage, the pre-program verify voltage, the re-program verify voltage, the read voltage, and so on. In some embodiments, the program voltage is an ISPP voltage. The pre-program verify voltage is typically lower than the re-program verify voltage.

Control circuit 250 controls page buffer unit 220, row decoder 230, and voltage generator 240 to program the multi-bit data provided from the controller to memory cell array 210. Control circuit 250 pre-programs the multi-bit data to the multi-level cells, reads the pre-programmed multi-bit data from the multi-level cells based on the state group codes, and re-programs the read multi-bit data to the multi-level cells by controlling page buffer unit 220, row decoder 230, and voltage generator 240. For example, control circuit 250 typically controls row decoder 230 and voltage generator 240 such that the program voltage, the pre-program verify voltage, or the re-program verify voltage are applied to the selected wordline, and the pass voltage is applied to the non-selected wordlines during the program operation.

Nonvolatile memory device 200 performs the read operation based on the state group codes after the pre-program operation. Accordingly, nonvolatile memory device 200 can perform the re-program operation without full-page data loading by an external controller, and the time of the re-program operation may be reduced.

Figure 7:
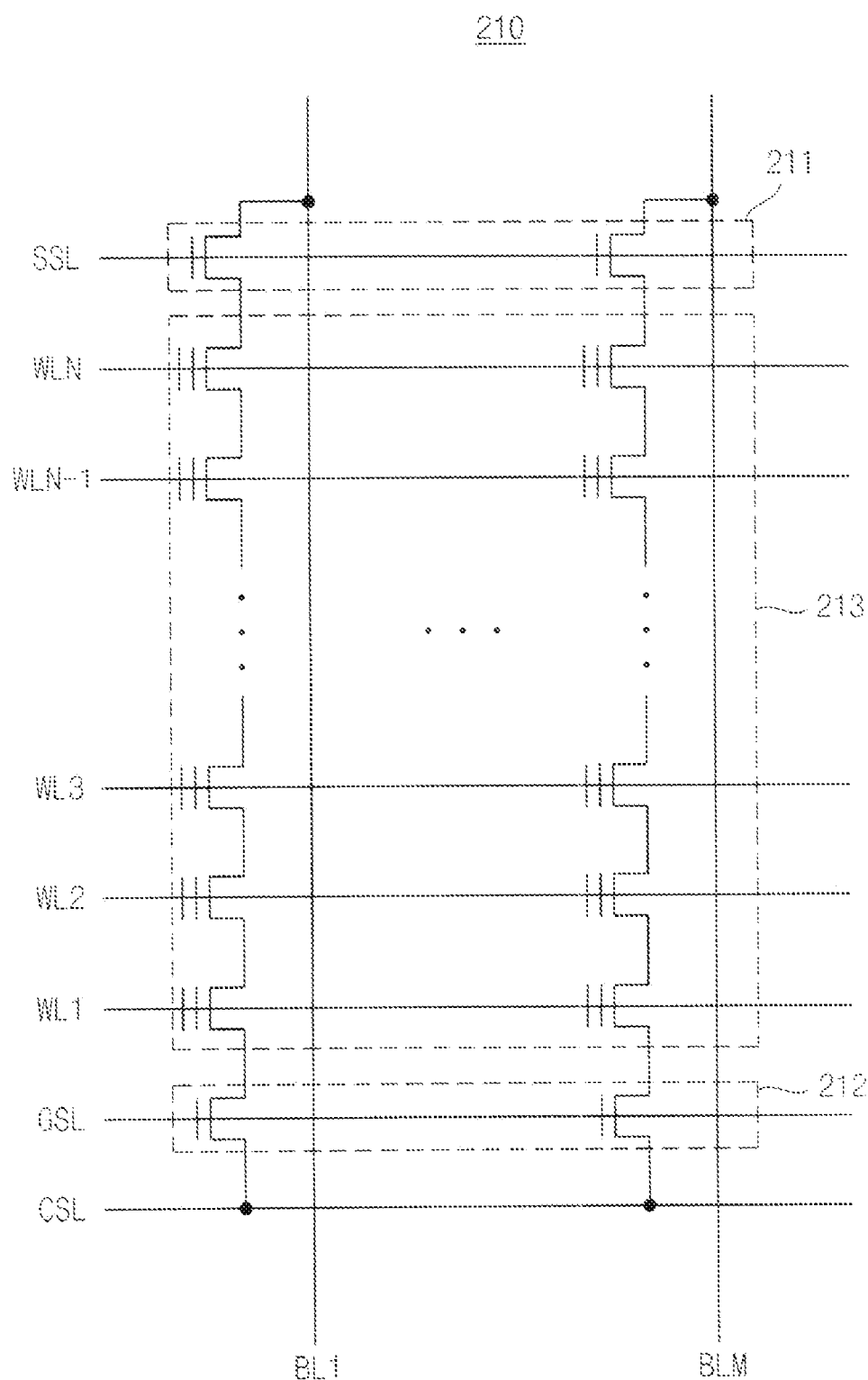
FIG. 7 is a circuit diagram illustrating an example of a memory cell array included in the nonvolatile memory device of FIG. 6.

FIG. 7 is a circuit diagram illustrating an example of a memory cell array included in a nonvolatile memory device of FIG. 6. Referring to FIG. 7, memory cell array 210 comprises a plurality of string select transistors 211, a plurality of ground select transistors 212, and a plurality of multi-level cells 213.

String select transistors 211 are connected to bitlines BL1 through BLM, and ground select transistors 212 are connected to a common source line CSL. Multi-level cells 213 are connected in series between string select transistors 211 and ground select transistors 212. Control gates of multi-level cells 213 in the same row are connected to the same wordline among wordlines WL1 through WLN. String select transistors 211 are controlled by a voltage applied to a string select line SSL, and ground select transistors 212 are controlled by a voltage applied to a ground select line GSL. Multi-level cells 213 are controlled by voltages applied to wordlines WL1 through WLN. Multi-level cells 213 store multi-bit data.

Figure 8:
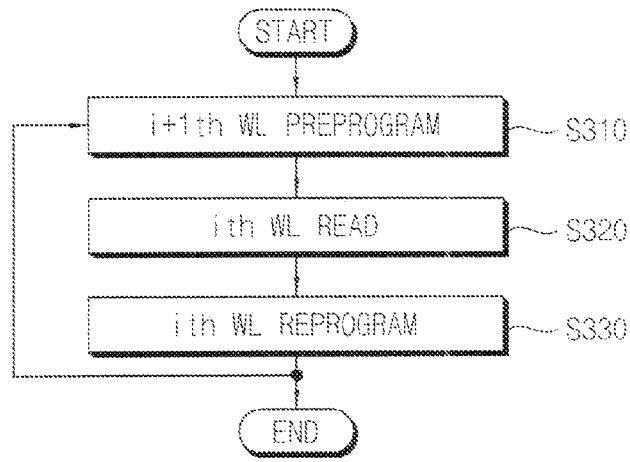
FIG. 8 is a flow chart illustrating an example of the method of FIG. 1.

FIG. 8 is a flow chart illustrating an example of the program method of FIG. 1. In this example, after a pre-program operation is performed for multi-level cells connected to a next wordline, a read operation and a re-program operation are performed for multi-level cells connected to a current wordline. The current and next wordlines are adjacent to each other.

Referring to FIGS. 7 and 8, first multi-bit data is pre-programmed in multi-level cells connected to first wordline WL1. Before the read operation and the re-program operation for the multi-level cells connected to first wordline WL1, second multi-bit data is pre-programmed in multi-level cells connected to second wordline WL2 (S310).

In some embodiments, the pre-program operation comprises page pre-program operations for pre-programming different levels of the multi-bit data, such as an LSB page, a CSB page, and so on. A page pre-program operation for an adjacent wordline may be performed between page pre-program operations for a wordline. For example, the pre-program operation for the multi-level cells connected to first wordline WL1 may be performed in order of a first page pre-program for first wordline WL1, a first page pre-program for second wordline WL2, a second page pre-program for first wordline WL1, a first page pre-program for third wordline WL3, a second page pre-program for second wordline WL2, and a third page pre-program for first wordline WL1. After the pre-program operation for the multi-level cells connected to first wordline WL1, the pre-program operation for the multi-level cells connected to second wordline WL2 may be performed in order of a first page pre-program for a fourth wordline, a second page pre-program for third wordline WL3, and a third page pre-program for second wordline WL2.

After the pre-program operation for the multi-level cells connected to second wordline WL2, the first multi-bit data is read from the multi-level cells connected to first wordline WL1 (S320), and the read first multi-bit data is re-programmed to the multi-level cells connected to first wordline WL1 (S330).

After the read operation and the re-program operation for the multi-level cells connected to first wordline WL1, third multi-bit data is pre-programmed in multi-level cells connected to third wordline WL3 (S310). After the pre-program operation for the multi-level cells connected to third wordline WL3, the second multi-bit data is read from the multi-level cells connected to second wordline WL2 (S320), and the read second multi-bit data is re-programmed to the multi-level cells connected to second wordline WL2 (S330). Similarly, the multi-bit data may be programmed to multi-level cells connected to wordlines WL3 through WLN.

As indicated by the above description, since a read operation and a re-program operation for a wordline are performed after the pre-program operation for a next wordline is performed, the multi-level cells connected to the wordline may be less affected by coupling due to memory cells connected to the next wordline.

Figure 9:
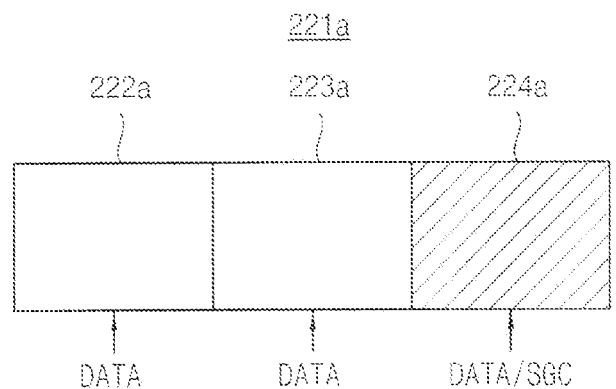
FIG. 9 is a block diagram illustrating an example of a page buffer included in the nonvolatile memory device of FIG. 6.

FIG. 9 is a block diagram illustrating an example of page buffer 221 included in nonvolatile memory device 200 of FIG. 6. This example of page buffer 221 is labeled page buffer 221a to distinguish it from other examples of page buffer 221 illustrated in FIGS. 10 and 11.

Referring to FIG. 9, page buffer 221a comprises a first data latch 222a, a second data latch 223a, and a third data latch 224a.

First data latch 222a, second data latch 223a, and third data latch 224a temporarily store three bits of multi-bit data. In particular, first data latch 222a stores a first bit (e.g., a LSB) of the multi-bit data, second data latch 223a stores a second bit of the multi-bit data, and third data latch 224a stores a third bit (e.g., a MSB) of the multi-bit data. Third data latch 224a is used as a state group code latch that temporarily stores a state group code.

In some embodiments, after the multi-bit data is pre-programmed in a multi-level cell, third data latch 224a temporarily stores the state group code received from a controller when the pre-programmed multi-bit data is verified. For example, referring again to FIG. 7, second multi-bit data for a multi-level cell connected to second wordline WL2 is loaded to page buffer 221a, and a pre-program operation is performed for the multi-level cell connected to second wordline WL2 based on the second multi-bit data loaded to page buffer 221a. During the pre-program operation for the multi-level cell connected to second wordline WL2, a state group code for a multi-level cell connected to first wordline WL1 is loaded to third data latch 224a by the controller. In some embodiments, the state group code may be loaded during a verify operation of the pre-program operation. For example, after a fifth threshold voltage distribution P4 of FIG. 4 is verified, the state group code may be loaded to third data latch 224a by the controller.

After the state group code is loaded, a read operation for the multi-level cell connected to first wordline WL1 is performed based on the state group code stored in third data latch 224a. In the read operation, page buffer 221a stores first multi-bit data pre-programmed in the multi-level cell connected to first wordline WL1. For example, where the first multi-bit data is "001", the multi-level cell connected to first wordline WL1 has a third threshold voltage distribution P2 of FIG. 3. Since the third threshold voltage distribution P2 is included in first state group GROUP1, third data latch 224a stores state group code "1". In the read operation, first data latch 222a and second data latch 223a store a first bit "1" of the first multi-bit data and a second bit "0" of the first multi-bit data, respectively. The state group code stored in third data latch 224a may be inverted based on the bits stored in first data latch 222a and second data latch 223a. Where first data latch 222a and second data latch 223a stores bits "10" or "01", a bit stored in third data latch 224a may be inverted. Third data latch 224a may store bit "0" by inverting state group code "1". Accordingly, after the read operation, page buffer 221a may store first multi-bit data "001".

After the read operation for the multi-level cell connected to first wordline WL1, a re-program operation for the multi-level cell connected to first wordline WL1 is performed based on the first multi-bit data stored in page buffer 221a. After the re-program operation for the multi-level cell connected to first wordline WL1, third multi-bit data for a multi-level cell connected to third wordline WL3 is loaded to page buffer 221a, and a pre-program operation for the multi-level cell connected to third wordline WL3 is performed based on the third multi-bit data stored in page buffer 221a. During the pre-program operation for the multi-level cell connected to third wordline WL3, a state group code of the multi-level cell connected to second wordline WL2 is loaded to third data latch 224a by the controller.

Nonvolatile memory device 200 with page buffer 221a performs the re-program operation by loading the state group code of one page without loading the full-page data, for example, of three pages. Accordingly, the time of the re-program operation is generally reduced. Further, since loading the state group code is performed during a pre-program operation, the time of the re-program operation may be further reduced.

In many conventional nonvolatile memory systems, a controller must store the multi-bit data until the controller reloads the multi-bit data to a nonvolatile memory device for the re-program operation. However, since the controller in certain embodiments of the inventive concept does not store the multi-bit data after loading the multi-bit data for the pre-program operation, the controller may efficiently use a buffer memory. Nonvolatile memory device 200 with page buffer 221a may store the state group code without an additional latch.

Figure 10:
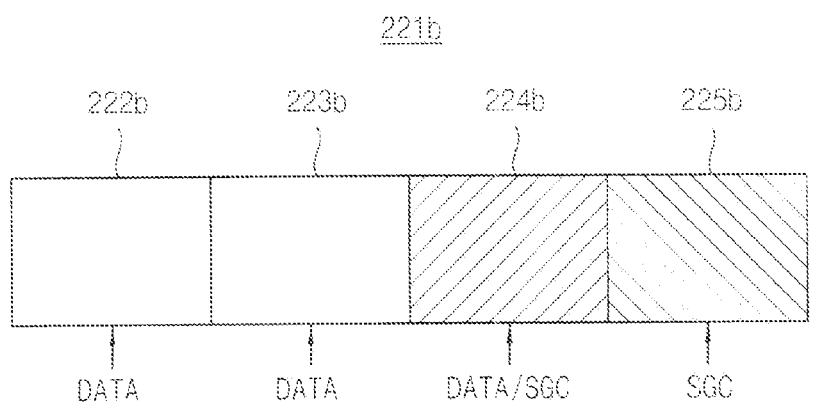
FIG. 10 is a block diagram illustrating another example of a page buffer included in the nonvolatile memory device of FIG. 6.

FIG. 10 is a block diagram illustrating another example of page buffer 221 included in nonvolatile memory device 200 of FIG. 6.

Referring to FIG. 10, a page buffer 221b comprises a first data latch 222b, a second data latch 223b, a third data latch 224b, and a state group code latch 225b.

First data latch 222b, second data latch 223b, and third data latch 224b temporarily store three bits of multi-bit data, respectively. State group code latch 225b temporarily stores a first state group code. Third data latch 224b is used as a state group code latch that temporarily stores a second state group code. For example, the first state group code typically indicates a state group of a multi-level cell connected to a currently selected wordline, and the second state group code typically indicates a state group of a multi-level cell connected to an adjacent wordline.

In some embodiments, a state group code is generated by identifying a threshold voltage of a multi-level cell after the multi-bit data is pre-programmed in the multi-level cell but before threshold voltage distributions become overlapped, and third data latch 224b or state group code latch 225b temporarily store the generated state group code. For example, in one embodiment, first multi-bit data is loaded to first data latch 222b, second data latch 223b, and third data latch 224b, and a pre-program operation for a multi-level cell connected to first wordline WL1 is performed based on the loaded first multi-bit data. After the pre-program operation, but before threshold voltage distributions overlap due to coupling, a first state group code is generated by identifying a threshold voltage of the multi-level cell by applying a read voltage to first wordline WL1.

The generated first state group code is stored in state group code latch 225b. Thereafter, second multi-bit data is loaded to first data latch 222b, second data latch 223b, and third data latch 224b, and a pre-program operation is performed for a multi-level cell connected to second wordline WL2 based on the loaded second multi-bit data. Shortly after the pre-program operation for the multi-level cell connected to second wordline WL2, a second state group code is generated by identifying a threshold voltage of the multi-level cell connected to second wordline WL2 by applying the read voltage to second wordline WL2. The generated second state group code is stored in third data latch 224b. After the second state group code is stored in third data latch 224b, a read operation and a re-program operation for the multi-level cell connected to first wordline WL1 are performed based on the first state group code stored in state group code latch 225b.

In some embodiments, a state group code is loaded from a controller to third data latch 224b or state group code latch 225b during a verification portion of a pre-program operation. For example, in one embodiment, first multi-bit data is loaded to first data latch 222b, second data latch 223b, and third data latch 224b, and a pre-program operation for a multi-level cell connected to first wordline WL1 is performed based on the loaded first multi-bit data. During a verify operation of the pre-program operation, a first state group code for the multi-level cell connected to first wordline WL1 is loaded to state group code latch 225b by the controller. Thereafter, second multi-bit data is loaded to first data latch 222b, second data latch 223b, and third data latch 224b, and a pre-program operation for a multi-level cell connected to second wordline WL2 is performed based on the loaded second multi-bit data.

During a verify operation of the pre-program operation for the multi-level cell connected to second wordline WL2, a second state group code for the multi-level cell connected to second wordline WL2 is loaded to third data latch 224b by the controller. After the second state group code is stored in third data latch 224b, a read operation and a re-program operation for the multi-level cell connected to first wordline WL1 are performed based on the first state group code stored in state group code latch 225b.

Nonvolatile memory device 200 with page buffer 221b performs a re-program operation without loading full-page data, thereby reducing the time of the re-program operation. In many conventional nonvolatile memory systems, a controller must store the multi-bit data and reloads it to a nonvolatile memory device for the re-program operation. However, in certain embodiments of the inventive concept, the controller is not required to store the multi-bit data after loading the multi-bit data for the pre-program operation, allowing the controller to efficiently use a buffer memory.

Figure 11:
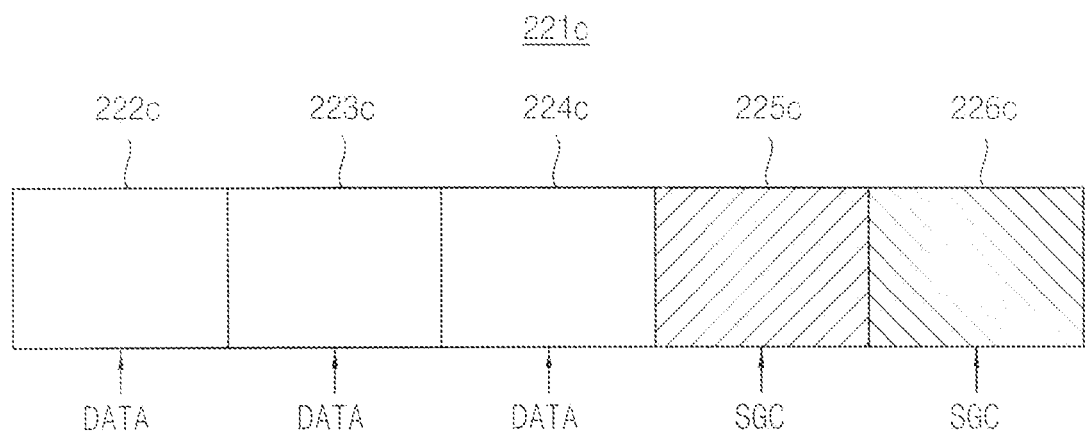
FIG. 11 is a block diagram illustrating yet another example of a page buffer included in the nonvolatile memory device of FIG. 6.

FIG. 11 is a block diagram illustrating still another example of page buffer 221 included in nonvolatile memory device 200 of FIG. 6.

Referring to FIG. 11, a page buffer 221c comprises a first data latch 222c, a second data latch 223c, a third data latch 224c, a first state group code latch 225c, and a second state group code latch 226c.

First data latch 222c, second data latch 223c, and third data latch 224c temporarily store three bits of multi-bit data, collectively. First state group code latch 225c temporarily stores a first state group code, and second state group code latch 226c temporarily stores a second state group code. The first state group code indicates a state group of a multi-level cell connected to a currently selected wordline, and the second state group code indicates a state group of a multi-level cell connected to an adjacent wordline.

In some embodiments, a state group code is generated based on multi-bit data loaded in page buffer 221c, and first state group code latch 225c or second state group code latch 226c temporarily stores the generated state group code. Page buffer 221c typically further comprises a logic circuit that performs a logical operation on bits of the multi-bit data temporarily stored in first data latch 222c, second data latch 223c, and third data latch 224c.

For example, in one embodiment, first multi-bit data is loaded to first data latch 222c, second data latch 223c, and third data latch 224c, and a first state group code for a multi-level cell connected to first wordline WL1 is generated based on the loaded first multi-bit data. The first state group code is temporarily stored in first state group code latch 225c. A pre-program operation for the multi-level cell connected to first wordline WL1 is performed based on the loaded first multi-bit data. Thereafter, second multi-bit data is loaded to first data latch 222c, second data latch 223c, and third data latch 224c, and a second state group code for a multi-level cell connected to second wordline WL2 is generated based on the loaded second multi-bit data. The second state group code is temporarily stored in second state group code latch 226c.

A pre-program operation for the multi-level cell connected to second wordline WL2 is performed based on the loaded second multi-bit data. After the pre-program operation for the multi-level cell connected to second wordline WL2, a read operation and a re-program operation for the multi-level cell connected to first wordline WL1 may be performed based on the first state group code stored in first state group code latch 225c.

In some embodiments, where the multi-bit data is loaded from a controller to a page buffer 221c for a pre-program operation, a state group code may be loaded from the controller to first state group code latch 225c or second state group code latch 226c.

For example, in some embodiments, where first multi-bit data is loaded to first data latch 222c, second data latch 223c, and third data latch 224c, a first state group code for a multi-level cell connected to first wordline WL1 is loaded to first state group code latch 225c by the controller. A pre-program operation for the multi-level cell connected to first wordline WL1 is performed based on the loaded first multi-bit data. Thereafter, second multi-bit data is loaded to first data latch 222c, second data latch 223c, and third data latch 224c, and a second state group code for a multi-level cell connected to second wordline WL2 is loaded to second state group code latch 226c by the controller. A pre-program operation for the multi-level cell connected to second wordline WL2 is performed based on the loaded second multi-bit data. After the pre-program operation for the multi-level cell connected to second wordline WL2, a read operation and a re-program operation are performed for the multi-level cell connected to first wordline WL1 based on the first state group code stored in first state group code latch 225c.

Nonvolatile memory device 200 with page buffer 221c performs the re-program operation without loading the full-page data, thereby reducing the time of the re-program operation.

Figure 12:
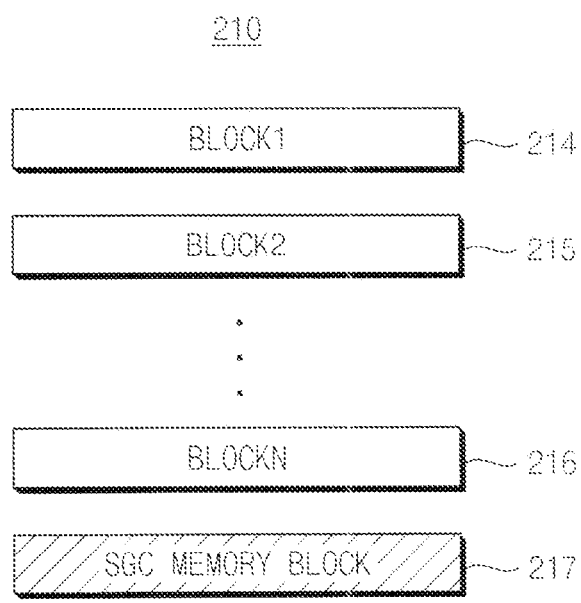
FIG. 12 is a block diagram illustrating another example of a memory cell array included in the nonvolatile memory device of FIG. 6.

FIG. 12 is a block diagram illustrating another example of memory cell array 210 included in nonvolatile memory device 200 of FIG. 6. In this example, memory cell array 210 comprises a plurality of data blocks 214, 215 and 216, and a state group code memory block 217.

Data blocks 214, 215 and 216 comprise multi-level cells that store multi-bit data. State group code memory block 217 stores state group codes of the multi-level cells included in data blocks 214, 215 and 216. State group code memory block 217 comprises single-level cells. In some embodiments, the state group codes are generated based on the multi-bit data loaded to a page buffer unit 220 of FIG. 6 in a pre-program operation, and state group code memory block 217 stores the generated state group codes. In other embodiments, state group code memory block 217 stores state group codes received from a controller when the multi-bit data is loaded to page buffer unit 220 by the controller. A read operation can be performed by reading the state group codes stored in state group code memory block 217.

Nonvolatile memory device 200 comprising state group code memory block 217 performs a re-program operation without loading the full-page data, thereby reducing the time of the re-program operation.

Figure 13:
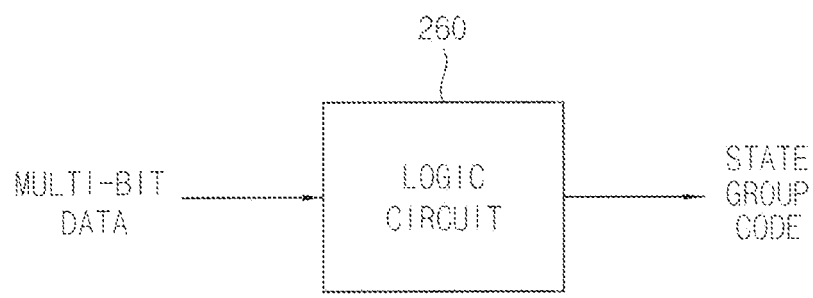
FIG. 13 is a block diagram illustrating a logic circuit included in the nonvolatile memory device of FIG. 6.

FIG. 13 is a block diagram illustrating a logic circuit 260 included in nonvolatile memory device 200 of FIG. 6.

Referring to FIG. 13, logic circuit 260 generates a state group code based on multi-bit data. In some embodiments, logic circuit 260 is included in a page buffer 221 of FIG. 6. In other embodiments, logic circuit 260 is included in a control circuit 250 of FIG. 6. Logic circuit 260 generates the state group code by performing a logical operation on bits of the multi-bit data loaded to the page buffer 221 of FIG. 6 for a pre-program operation.

Figure 14A:
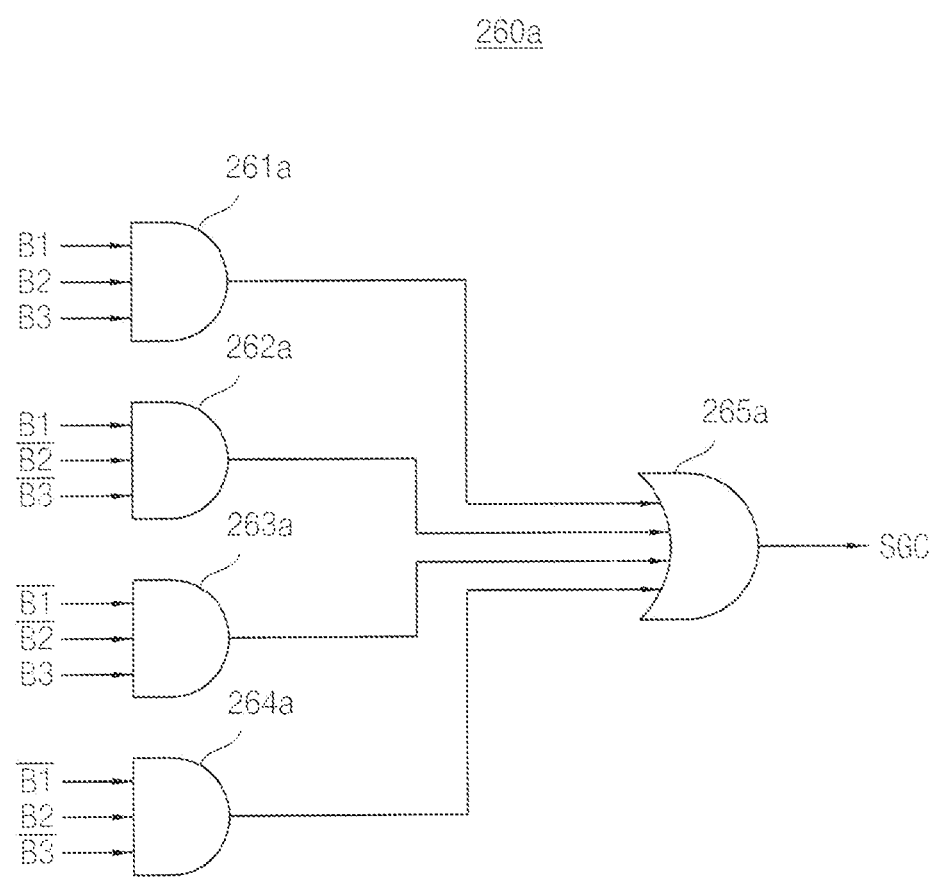
FIGS. 14A and 14B are block diagrams illustrating examples of the logic circuit of FIG. 13.
Figure 14B:
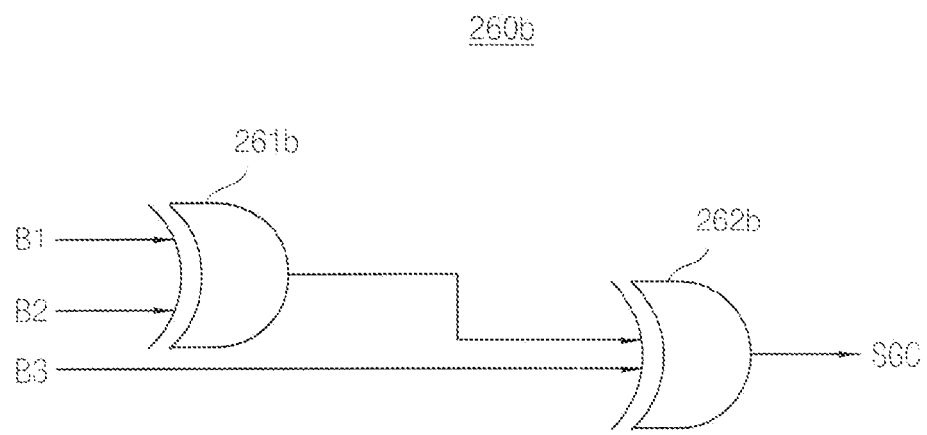

FIGS. 14A and 14B are block diagrams illustrating examples of logic circuit 260 of FIG. 13. FIG. 14A shows a first embodiment labeled as logic circuit 260a and FIG. 14B shows a second embodiment labeled as logic circuit 260b.

Referring to FIG. 14A, logic circuit 260a comprises first through fourth AND gates 261a, 262a, 263a and 264a, and an OR gate 265a. First AND gate 261a outputs a logical "1" where a first bit B1, a second bit B2, and a third bit B3 of multi-bit data has a logical "1". First bit B1 is a LSB, and third bit B3 is a MSB. That is, first AND gate 261a outputs a logical "1" where the multi-bit data is "111". Second AND gate 262a outputs a logical "1" where the multi-bit data is "001", third AND gate 263a outputs a logical "1" where the multi-bit data is "100", and fourth AND gate 264a outputs a logical "1" where the multi-bit data is "010". OR gate 265a performs a logical OR operation on outputs of first through fourth AND gates 261a, 262a, 263a, and 264a. Accordingly, logic circuit 260a outputs state group code "1" where the multi-bit data is "111", "001", "100", or "010".

Referring to FIG. 14B, logic circuit 260b comprises a first XOR gate 261b and a second XOR gate 262b. First XOR gate 261b performs a logical XOR operation on a first bit B1 and a second bit B2 of multi-bit data. First XOR gate 261b outputs a logical "1" where one of the first bit B1 and the second bit B2 is "1" and the other is "0". Second XOR gate 262b performs a logical XOR operation on a third bit B3 of multi-bit data and an output of first XOR gate 261b. Second XOR gate 262b outputs a logical "1" where one of the third bit B3 and the output of first XOR gate 261b is "1" and the other is "0". Accordingly, logic circuit 260b may output state group code "1" when the multi-bit data is "111", "001", "100", or "010".

While FIGS. 14A and 14B illustrate specific examples of a logic circuit 260, logic circuit 260 can be implemented with various alternative circuits. Further, logic circuit 260 can assume various alternative forms according to the number of bits of the multi-bit data.

Figure 15:
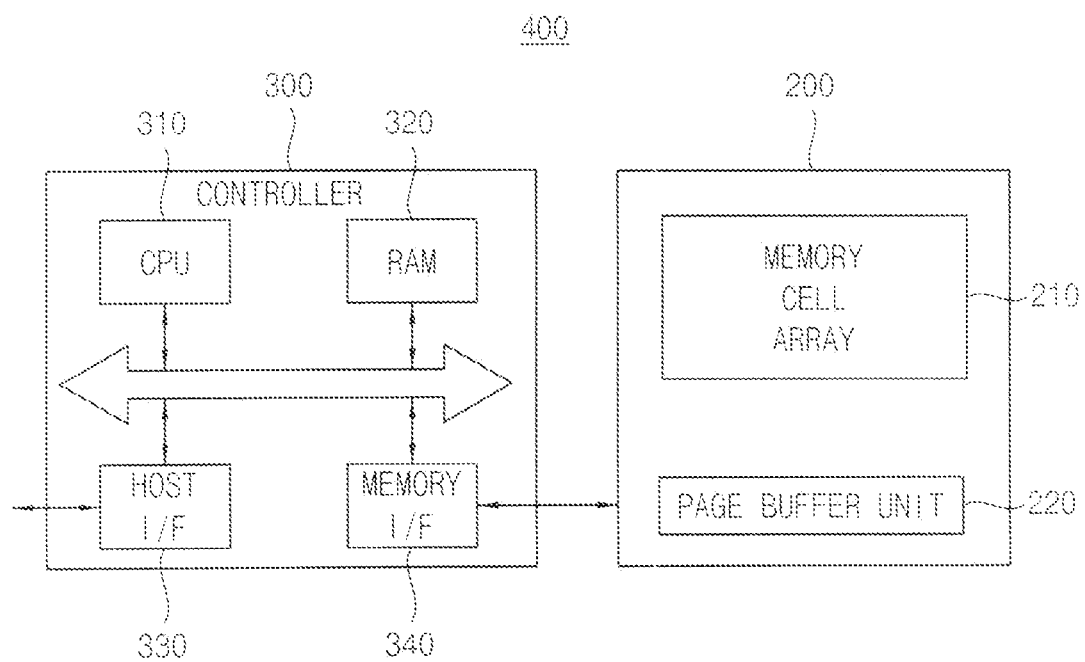
FIG. 15 is a block diagram illustrating a nonvolatile memory system incorporating the nonvolatile memory device of FIG. 6.

FIG. 15 is a block diagram illustrating a nonvolatile memory system 400 comprising nonvolatile memory device 200 of FIG. 6.

Referring to FIG. 15, nonvolatile memory system 400 comprises nonvolatile memory device 200 and a controller 300.

Nonvolatile memory device 200 comprises memory cell array 210 and page buffer unit 220. Page buffer unit 220 comprises a plurality of page buffers connected to a plurality of bitlines. The page buffers temporarily store multi-bit data, and memory cell array 210 comprises a plurality of multi-level cells connected to a plurality of wordlines and the plurality of bitlines. The multi-level cells are programmed to have narrow threshold voltage distributions through a pre-program operation, a read operation and a re-program operation. In some embodiments, the multi-level cells have various cell structures, such as a charge trapping flash structure, a stacked flash structure, a finned flash structure, or a flash structure without source and drain, to name but a few.

Controller 300 controls nonvolatile memory device 200. Controller 300 controls data transfer between an external host and nonvolatile memory device 200. Controller 300 comprises a central processing unit (CPU) 310, a buffer memory 320, a host interface 330 and a memory interface 340. CPU 310 performs data transfer. Host interface 330 is connected to the host, and memory interface 340 is connected to nonvolatile memory device 200. CPU 310 communicates with the host through host interface 330, and communicates with nonvolatile memory device 200 through memory interface 340.

Buffer memory 320 temporarily stores multi-bit data provided from the host or multi-bit data read from nonvolatile memory device 200. Controller 300 loads the multi-bit data provided from the host to page buffer unit 220 of nonvolatile memory device 200. Nonvolatile memory device 200 reads the multi-bit data based on state group codes, and therefore controller 300 is not required to load full-page data to nonvolatile memory device 200 for the re-program operation.

Accordingly, controller 300 may efficiently utilize buffer memory 320, and the capacity of buffer memory 320 can be reduced.

In some embodiments, controller 300 generates the state group codes based on the multi-bit data stored in buffer memory 320. For example, CPU 310 may generate the state group codes by performing logical operations on bits of the multi-bit data stored in buffer memory 320. The logical operations may be performed by software or hardware. In some embodiments, controller 300 comprises a logic circuit 260 such as those illustrated in FIGS. 13 and 14.

In some embodiments, controller 300 further comprises an error correction code (ECC) block. Buffer memory 320 typically comprises a dynamic random access memory (DRAM), a static random access memory (SRAM), a phase random access memory (PRAM), a ferroelectric random access memory (FRAM), a resistive random access memory (RRAM), a magnetic random access memory (MRAM), or another form of volatile or nonvolatile memory. Buffer memory 320 may operate as a working memory of CPU 310.

In some embodiments, nonvolatile memory system 400 is incorporated into a memory card, a solid state drive (SSD), or other potentially standalone memory product. In various alternative embodiments, controller 300 communicates with the host through a universal serial bus (USB) interface, a multi media card (MMC) interface, a peripheral component interconnect express (PCI-E) interface, an advanced technology attachment (ATA) interface, a serial ATA interface, a parallel ATA interface, a small computer system interface (SCSI), an enhanced small device (ESD) interface, an integrated drive electronics (IDE) interface, or the like.

Nonvolatile memory device 200 and/or controller 300 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 16:
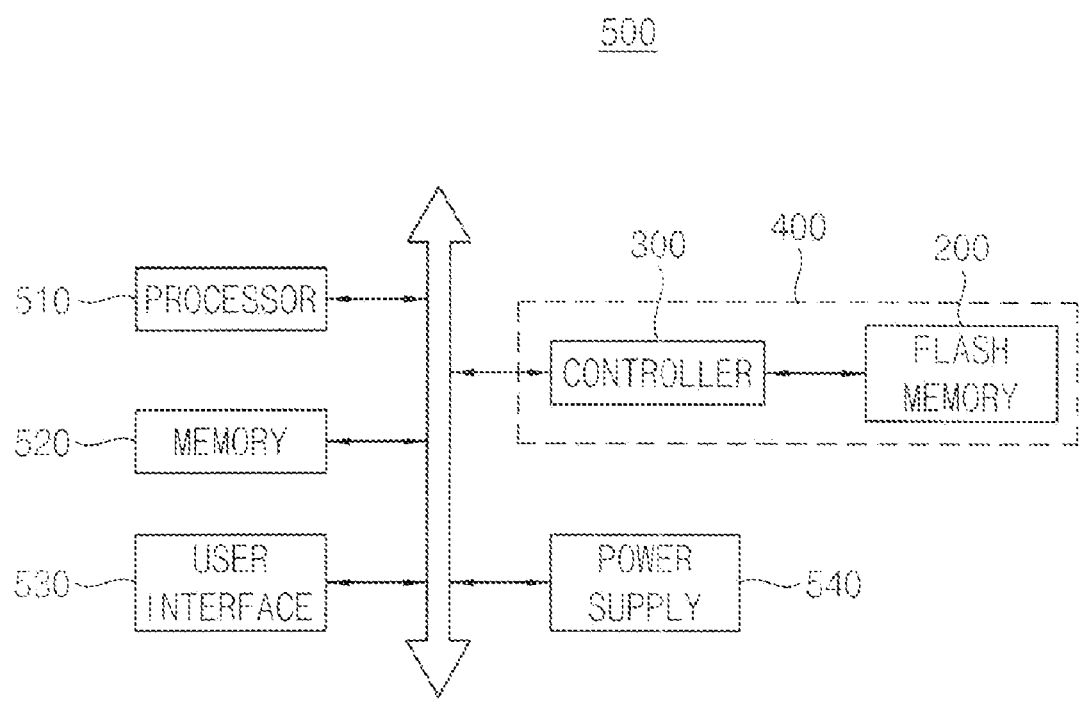
FIG. 16 is a block diagram illustrating a computing system incorporating the nonvolatile memory system of FIG. 15.

FIG. 16 is a block diagram illustrating a computing system 500 comprising nonvolatile memory system 400 of FIG. 15.

Referring to FIG. 16, computing system 500 comprises a processor 510, a memory device 520, a user interface 530, and nonvolatile memory system 400.

Processor 510 performs various computing functions, such as executing specific software for performing specific calculations or tasks. Processor 510 typically comprises a microprocessor or a CPU. Processor 510 is typically connected to memory device 520 via an address bus, a control bus and/or a data bus. Memory device 520 typically comprises a volatile memory such as a DRAM or SRAM, or a non-volatile memory such as an erasable programmable read-only memory (EPROM) or an electrically erasable programmable read-only memory (EEPROM). Processor 510 is connected to an expansion bus, such as a peripheral-component-interconnect (PCI) bus. Processor 510 controls user interface 530, which may comprise, for instance, an input device (e.g., a keyboard or a mouse), an output device (e.g., a printer or a display device) and a storage device (e.g., a hard disk drive or a compact disk read-only memory (CD-ROM)). Computing system 500 further comprises a power supply 540 for supplying operational power. Computing system 500 may further comprise an application chipset, a camera image processor (CIS), and a mobile DRAM.

Computing system 500 can be used to implement any of several different electronic devices, such as a mobile phone, a personal digital assistant (PDA), a digital camera, a gaming machine, a portable multimedia player (PMP), a music player, a desktop computer, a notebook computer, a speaker, a video player, a television, a smart phone, a handheld computer, or a universal serial bus (USB) device, to name but a few.

As indicated by the above description, nonvolatile memory device 200, nonvolatile memory system 400, and related methods of programming can provide enhanced performance by performing a re-program operation without full-page data loading by a controller.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concept. Accordingly, all such modifications are intended to be included within the scope of the inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of programming a nonvolatile memory device comprising a plurality of multi-level cells, the method comprising:
   pre-programming multi-bit data in the plurality of multi-level cells;
   reading the pre-programmed multi-bit data from the plurality of multi-level cells based on state group codes indicating state groups of the plurality of multi-level cells; and
   re-programming the read multi-bit data in the plurality of multi-level cells,
   wherein each of the state groups corresponds to a set of non-overlapping threshold voltage distributions.

2. The method of claim 1, wherein the number of the state groups is determined based on a maximum number of overlapping threshold voltage distributions of the plurality of multi-level cells.

3. The method of claim 2, wherein the number of bits in each state group code is determined by the number of the state groups.

4. The method of claim 1, further comprising:
   operating a controller to load the multi-bit data in a page buffer unit of the nonvolatile memory device to pre-program the loaded multi-bit data in the plurality of multi-level cells.

5. The method of claim 4, further comprising:
   generating the state group codes based on the multi-bit data loaded in the page buffer unit.

6. The method of claim 5, wherein generating the state group codes comprises:
   performing a logical operation on bits of the loaded multi-bit data to generate the state group codes.

7. The method of claim 5, further comprising:
   temporarily storing the generated state group codes in the page buffer unit.

8. The method of claim 5, further comprising:
   storing the generated state group codes in a state group code memory block.

9. The method of claim 8, wherein the state group code memory block comprises single-level cells.

10. The method of claim 4, further comprising:
    operating the controller to load the state group codes to the page buffer unit.

11. The method of claim 1, further comprising:
    identifying threshold voltages of the multi-level cells after the multi-bit data is pre-programmed in the multi-level cells; and
    generating the state group codes based on the identified threshold voltages.

12. The method of claim 1, wherein reading the pre-programmed multi-bit data comprises:
    reading the pre-programmed multi-bit data on a state group basis by applying different read voltages according to the state group codes.

13. The method of claim 1, wherein pre-programming the multi-bit data comprises applying pre-program verify voltages having magnitudes lower than desired threshold voltages, and
    wherein re-programming the read multi-bit data comprises applying re-program verify voltages having magnitudes substantially the same as the desired threshold voltages.

14. A method of programming a nonvolatile memory device comprising a first plurality of multi-level cells connected to a first wordline and a second plurality of multi-level cells connected to a second wordline, the method comprising:
    pre-programming first multi-bit data in the first plurality of multi-level cells;
    pre-programming second multi-bit data in the second plurality of multi-level cells;
    reading the pre-programmed first multi-bit data from the first plurality of multi-level cells based on first state group codes indicating state groups of the first plurality of multi-level cells; and
    re-programming the read first multi-bit data in the first plurality of multi-level cells.

15. The method of claim 14, wherein the second wordline is adjacent to the first wordline.

16. The method of claim 14, wherein the pre-programmed first multi-bit data is read from the first plurality of multi-level cells after the second multi-bit data is pre-programmed in the second plurality of multi-level cells.

17. The method of claim 14, further comprising:
    pre-programming third multi-bit data in a third plurality of multi-level cells connected to a third wordline, wherein the third wordline is adjacent to the second wordline;
    reading the pre-programmed second multi-bit data from the second plurality of multi-level cells based on second state group codes after the third multi-bit data is pre-programmed in the third plurality of multi-level cells; and
    re-programming the read second multi-bit data to the second plurality of multi-level cells.

18. A nonvolatile memory device, comprising:
    a plurality of multi-level cells; and
    a control circuit that controls the nonvolatile memory device to perform a pre-programming operation to pre-program multi-bit data in the plurality of multi-level cells, a read operation to read the pre-programmed multi-bit data from the plurality of multi-level cells based on state group codes indicating state groups of the plurality of multi-level cells, and a re-programming operation to re-program the read multi-bit data in the plurality of multi-level cells,
wherein each of the state groups corresponds to a set of non-overlapping threshold voltage distributions.

19. A method of programming a nonvolatile memory device, the method comprising:
   operating a controller to load multi-bit data in a page buffer unit of the nonvolatile memory device;
   programming the multi-bit data in a first memory block;
   reading the multi-bit data from the first memory block;
   performing, at a logic circuit included in the page buffer unit, a logical operation on bits of the read multi-bit data to generate a state group code; and
   programming the state group code in a second memory block.

20. The method of claim 19, further comprising:
   temporarily storing the state group code in a latch included in the page buffer unit during programming the state group code in the second memory block.

21. The method of claim 19, wherein programming the state group code is performed without data re-loading from the controller after programming the multi-bit data.

22. The method of claim 19, wherein the second memory block is the same as the first memory block.

23. The method of claim 19, wherein the second memory block is different from the first memory block.

24. The method of claim 23, wherein the first memory block includes single-level cells, and
   wherein the second memory block includes multi-level cells.

25. A method of programming a nonvolatile memory device, the method comprising:
   loading multi-bit data in a page buffer unit of the nonvolatile memory device;
   performing a logical operation on bits of the multi-bit data to generate a state group code, the state group code indicating one of two or more state groups; and
   programming the state group code in memory cells.

26. The method of claim 25, wherein loading the multi-bit data in the page buffer unit comprises:
   operating a controller to load the multi-bit data in the page buffer unit.

27. The method of claim 26, wherein programming the state group code is performed without data re-loading from the controller.

28. The method of claim 25, wherein loading the multi-bit data in the page buffer unit comprises:
   reading the multi-bit data from a memory block where the multi-bit data are stored.

29. The method of claim 28, wherein the memory block includes single-level cells.

30. The method of claim 25, wherein a number of bits included in each multi-bit data is two, and
   wherein a number of bits included in the state group code is one.

31. The method of claim 25, wherein a number of bits included in each multi-bit data is three, and
   wherein a number of bits included in the state group code is one.

32. The method of claim 25, wherein a number of bits included in each multi-bit data is three, and
   wherein a number of bits included in the state group code is two.

* * * * *